United States Patent [19]
Wright

[11] Patent Number: 5,070,876
[45] Date of Patent: Dec. 10, 1991

[54] FLOW-INDEPENDENT MAGNETIC RESONANCE PROJECTION ANGIOGRAPHY

[75] Inventor: Graham A. Wright, Palo Alto, Calif.

[73] Assignee: The Board of Trustees of the Leland Stanford Junior University, Stanford, Calif.

[21] Appl. No.: 390,629

[22] Filed: Aug. 7, 1989

[51] Int. Cl.$^5$ ............................................. A61B 5/055
[52] U.S. Cl. .................................... 128/653.3; 324/306
[58] Field of Search .................. 128/653; 324/306, 309

[56] References Cited

U.S. PATENT DOCUMENTS

| | | | |
|---|---|---|---|
| 4,523,596 | 6/1985 | Macovski | 128/653 |
| 4,581,582 | 4/1986 | Redington | 324/309 |
| 4,720,679 | 1/1988 | Patrick et al. | 324/309 |
| 4,836,209 | 6/1989 | Nishimura | 324/306 |

OTHER PUBLICATIONS

G. A. Wright, D. G. Nishimura, A. Macovski "Flow-Independent MR Projection Angiography", Magnetic Resonance Systems Research Laboratory, Stanford University (unpublished).
V. Wedeen, R. Meuli, R. Edelman, S. Geller, L. Frank, T. Brady, and R. Rosen, "Projective Imaging of Pulsatile Flow with Magnetic Resonance", Science, 230, 946–948, (1985).
C. Dumoulin, S. Souza, M. Walker, and W. Wagle "Three-Dimensional Phase Contrast Angiography", Magnetic Resonance in Medicine, 9, (1989).
W. Dixon, L. Du, D. Faul, M. Gado, and S. Rossnick, "Projection Angiograms of Blood Labeled by Adiabatic Fast Passage", Magnetic Resonance in Medicine, 3, 454–462, (1986).
D. Nishimura, A. Macovski, J. Jackson, R. Hu, C. Tevick, and L. Axel, "Magnetic Resonance Angiography by Selective Inversion Recovery Using a Compact Gradient Echo Sequence", Magnetic Resonance in Medicine, 8, 96–103, (1988).
C. Dumoulin, H. Cline, S. Souza, W. Wagle, and M. Walker, "Three Dimensional Time-of-Flight Magnetic Resonance Angiography Using Spin Saturation", Magnetic Resonance Medicine, 11, 35–46, (1989).
G. Laub, E. Muller, W. Loeffler, B. Kiefer, and P. Ruggieri, "Application of Gradient Echo Sequences for High Resolution Three-Dimensional Flow Studies", Seventh Annual Meeting of Society of Magnetic Resonance in Medicine, (1988).
C. Dumoulin and H. Hart, "Magnetic Resonance Angiography[1]", Radiology, 161, 717–720, (1986).
G. Glover, "Instrument Consideration in MR Flow Imaging", Workshop on MR Imaging of Blood Flow, (1989).
K. Thulborn, J. Waterton, P. Matthews, and G. Radda, "Oxygenation Dependence of the Transverse Relaxation Time of Water Protons in Whole Blood at High Field", Biochimica et Biophysica Acta, 714, 265–270, (1982).
J. Gomori, R. Grossman, C. Yu-Ip, and T. Asakura, "NMR Relaxation Times of Blood: Dependence of Field Strength, Oxidation State, and Cell Integrity", Journal of Computer Assisted Tomography, 11(4), 684–690, (1987).
R. Brooks and G. D. Chiro, "Magnetic Resonance Im- (List continued on next page.)

Primary Examiner—Lee S. Cohen
Assistant Examiner—John D. Zele
Attorney, Agent, or Firm—Henry K. Woodward

[57] ABSTRACT

The performance of current, flow-based sequences for imaging vasculature using MR is severely restricted in regions with inherently slow flow. We address this problem with a flow-independent imaging method. Specifically, we generate projection images of blood in the limbs while suppressing signals from all other tissues (primarily skeletal muscle, bone marrow, and subcutaneous fat) using a flow-compensated, water-selective, short TI inversion recovery sequence with a long echo time. We experimentally evaluate the effectiveness of this sequence and present in vivo results clearly demonstrating the method's potential.

6 Claims, 9 Drawing Sheets

OTHER PUBLICATIONS aging of Stationary Blood: A Review", Medical Physics, 14(6), 903-1091, (1987).

R. Bryant, K. Marill, C. Blackmore, and C. Francis, "Magnetic Relaxation in Blood and Blood Clots".

J. MacFall, F. Wehrli, R. Breger, and G. Johnson, "Methodology for the Measurement and Analysis of Relaxation Times in Proton Imaging", Magnetic Resonance Imaging, 5, 209-220, (1987).

P. Bottomley, T. Foster, R. Argersinger, and L. Pfeifer, "Review of Normal Tissue Hydrogen NMR Relaxation Times and Relaxation Mechanisms From 1-100 MHz: Dependence on Tissue Type, NMR Frequency, Temperature, Species, Excision, and Age", Medical Physics, 11(4), 425-448, (Jul./Aug. 1984.)

W. Ganong, "Gas Transport Between the Lungs & the Tissues", Review of Medical Physiology, Lange Medical Publications, (1981).

F. Wehrli, "Signal-to-Noise and Contrast in MR Imaging", in NMR in Medicine: The Instrumentation and Clinical Applications (S. Thomas and R. Dixon, Eds.), pp. 32-58, American Institute of Physics, (1986).

G. Bydder and I. Yound, "MR Imaging, Clinical Use of the Inversion Recovery Sequence", Journal of Computer Assisted Tomography, 9(4), 659-675, (1985).

P. Hore, "A New Method for Water Suppression in the Proton NMR Spectra of Aqueous Solutions", Journal of Magnetic Resonance, 54, 539-542, (1983).

A. Shaka, S. Rucker, and A. Pines, "Iterative Carr-Purcell Trains", Journal of Magnetic Resonance, 77, 606-611, (1988).

M. Levitt, R. Freeman, and T. Frenkiel, "Broadband Decoupling in High-Resolution Nuclear Magnetic Resonance Spectroscopy", Advances in Magnetic Resonance, 11, 47, (1983).

D. Nishimura, A. Macvoski, and J. Pauly, IEEE Transactions in Medical Imaging, MI-5(3), 140-151, (1986).

W. Dreher and P. Bornert, "Pulse Sequence and Parameter Choice in NMR Imaging as a Problem of Constrained Multidimensional Nonlinear Optimization", Magnetic Resonance in Medicine, 8, 16-24, (1988).

C. Meyer, J. Pauly, A. Macovski, and D. Nishimura, "Simultaneous Spatial and Spectral Selective Excitation", Seventh Annual Meeting of Society of Magnetic Resonance in Medicine, (1988).

S. Rapaport, H. Sostman, C. Pope, C. Camputaro, W. Holcomb, and J. Gore, "Venous Clots: Evaluation with MR Imaging[1]", Radiology, 162, 527-530, (1987).

FLOW-INDEPENDENT MAGNETIC RESONANCE PROJECTION ANGIOGRAPHY

The U.S. government has rights in the disclosed invention pursuant to NIH Contracts No. 1R01-HL-39478 and No. HL-39478 and NSF contract No. ECS-8801708.

BACKGROUND OF THE INVENTION

This invention relates generally to magnetic resonance imaging (MRI), and more particularly the invention relates to flow independent projection angiography using MRI.

To date, imaging vasculature using magnetic resonance has relied almost exclusively on flow information via the phase distortion of spins moving through a gradient field or the wash-in of spins. These techniques are currently finding an array of clinical applications, particularly in the head and neck. However, in some situations where the clinician is interested in morphological information rather than velocity characteristics in the vessels, the flow sensitivity of these sequences can become a liability.

Consider the demands placed on an MR technique for imaging peripheral vascular anatomy. Such a method must generate high resolution images with a large, volumetric field of view and a high signal-to-noise ratio (SNR) in reasonable examination times. The sequence must suppress signals from all other tissues in the region and be insensitive to artifacts particularly those induced by body motion and blood flow. It should image vessels with a wide range of flow velocities and orientations. Robustness and simplicity are also important features for clinical application.

Phase contrast and wash-in methods experience several problems in this application, most notably in imaging the veins and smaller vessels of the peripheral region where flow is inherently slow. To be sensitive to low velocities, phase contrast methods must severely restrict the range of velocities that can be imaged without phase wrap. Doing so increases sensitivity to global motion artifacts as well as to signal loss caused by velocity dispersion within a vessel. Furthermore, the phase contrast methods require multiple acquisitions to image the full range of potential vessel orientations. Wash-in techniques suffer from inadequate vessel filling in the presence of slow flow. This restricts the potential imaging volume limiting the field of view and the SNR of the resultant images. Both phase contrast methods and time-of-flight selective tagging methods are sensitive to time-varying instabilities in the imaging system since they isolate a weak blood signal from a much larger stationary tissue signal by subtracting two signals acquired at different times.

Our goal is to image vascular anatomy, particularly vessels with a slow flow, without the problems of current sequences. By designing a sequence that is insensitive to flow, we minimize the flow-related problems faced by phase contrast and wash-in methods. However, by doing so, we eliminate the availability of flow information for distinguishing vessels from surrounding tissue. We must then rely on other NMR parameters, particularly the unique relaxation characteristics of blood and its chemical shift relative to fat, to isolate the blood-filled vessels. To avoid the artifacts inherent in techniques that combine multiple acquisitions, the sequence should leave only the blood signal present when data is recorded. To meet the stringent resolution, SNR, field of view, and examination time demands of vascular imaging, signals from projections through the volume of interest should be acquired. The challenge is to produce such a sequence that is also both simple and robust.

SUMMARY OF THE INVENTION

The present invention realizes the feasibility of one particular flow-independent technique for producing projection angiograms. Specifically, we design a pulse sequence to produce projection images of the limbs so that the blood signal is maximized while the signal from all other local tissues is minimized at acquisition time. We then experimentally verify the utility of various components of the sequence and present illustrative in vivo images. Finally, we discuss the advantages and limitations of the sequence and speculate on variations that tailor it to yield more specific information about the vasculature.

DETAILED DESCRIPTION OF ILLUSTRATIVE EMBODIMENTS

Described is the design of each element of the pulse sequence. In the extremities, the major sources of NMR signal include skeletal muscle, subcutaneous fat, bone marrow, and blood. As the NMR characteristics of bone marrow and subcutaneous fat are very similar, they are both henceforth referred to as fat. Thus, the objective of the angiography sequence is to eliminate fat and muscle while leaving the blood signal unaffected. As a first step, the flow-independent parameters with which one can differentiate these tissues are enumerated. Methods to suppress muscle and fat are then determined, using only variations of standard sequences for simplicity. Factors which reduce the signal from the tissue of interest, blood, and techniques to limit the effects of these factors are examined. Finally, the complete sequence is presented and the design process is briefly discussed.

Representative relaxation times and relative chemical shifts of muscle, fat, and blood in a $B_o$ field of 1.5T are listed in Table 1. The values are based on measurements by the inventor and data reported in the literature (see, for example, Bottomley et al. *Medical Physics*, 11(4), 425-448, 1984). Within the population, these values vary significantly; hence, in sequence design, the aim is for robustness in the presence of such variability.

TABLE 1

| NMR Parameters For Limb Tissues at 1.5 T | | | |
|---|---|---|---|
| Tissue | T1 (ms) | T2 (ms) | Chemical Shift (Hz) |
| Muscle | 800 | 35 | 0 |
| Fat | 260 | 60 | 230 |
| Blood | 930 | 10 to 180 | 0 |

The nature of blood's relaxation times is particularly complex and also particularly relevant in accomplishing the above goals. The T1 and T2 of blood, $T1_b$ and $T2_b$, depend on the state of the red blood cells, the percentage of the volume of blood occupied by red blood cells or hematocrit (Hct), the percentage of hemoglobin in the red blood cells that is oxygenated (% $HbO_2$), and time between 180° refocussing pulses while the signal is in the transverse plane ($\tau_{180}$). For this study, only normal vascular blood comprising primarily intact red blood cells and plasma with a hematocrit of about 40% is considered. These conditions yield the tabulated values of $T1_b$ and $T2_b$. The wide range for $T2_b$ in Table 1 is due to its dependence on the remaining parameters, % $HbO_2$ and $\tau_{180}$. Based on experimentally verified models (see, for example, Thulborn et al. *Biochimica et Biophysica Acta*, 714,265-270,1982), $T2_b$ is related to these parameters by the equation, $$\frac{1}{T2_b} = \frac{1}{T2_{oxy}} + P_r(1 -$$

$$P_r)\tau_{ex}\left[\left(1 - \frac{\% HbO_2}{100}\right)\alpha\omega_0\right]^2 \left(1 - \frac{2\tau_{ex}}{\tau_{180}} \tanh \frac{\tau_{180}}{2\tau_{ex}}\right). \quad (1)$$

Figure 1:
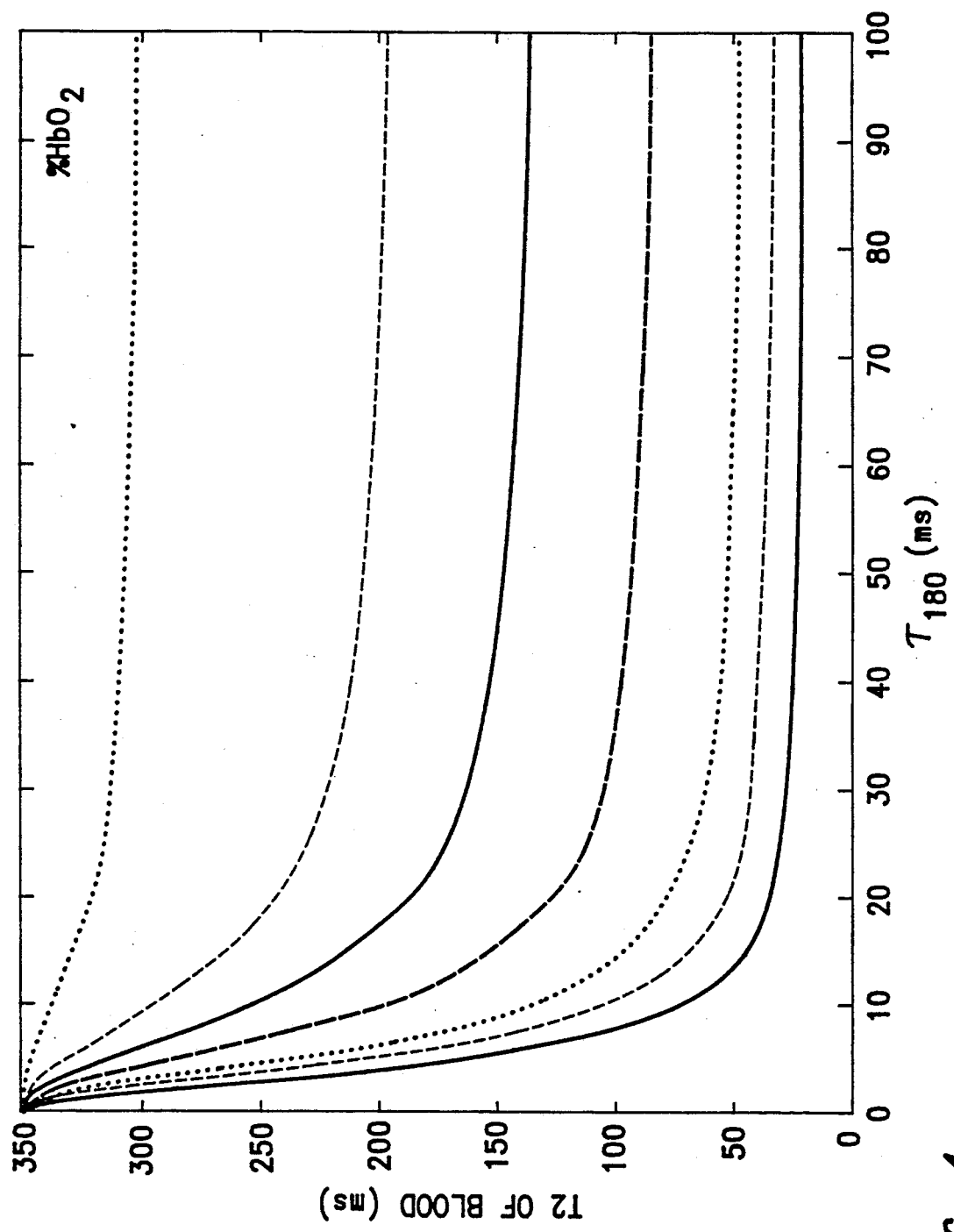
FIG. 1 is a graph illustrating the relationship between T2 of blood and time between refocusing pulses for various levels of blood oxygen saturation.

$T2_{oxy}$ is the transverse relaxation time of fully oxygenated blood; $\tau_{ex}$ is a characteristic 'exchange' time for blood; $\alpha$ is a dimensionless constant related to the magnetic susceptibility of deoxygenated hemoglobin and to the shape and spacing of the red blood cells. $P_r$, the fraction of water protons in the blood that are resident in the red blood cells, is proportional to Hct ($P_4 \approx 0.9$ Hct); $\omega_0$, the resonant frequency of protons in rad/s, is proportional to the main field, $B_0$. For $B_0 = 1.5T$ and Hct=40%, $T2_{oxy} \approx 0.18$ s, $P_r \approx 0.36$, and $\omega_0 = 4.0 \times 10^8$ rad/s. Based on measurements by the inventor $\tau_{ex} \approx 0.006$ s and $\alpha \approx 0.7$ ppm. FIG. 1 is a graphical representation of the relationship described by Eq. [1]. $T2_b$ decreases as $\tau_{180}$ increases, with most of the drop occurring as $\tau_{180}$ is incremented from 1 ms to about 40 ms. This effect is accentuated as % $HbO_2$ decreases. % $HbO_2$ is usually between 60 and 80% for venous blood (when the subject is at rest) and between 90 and 100% for arterial blood. Thus, the T2 of venous blood can range from 40 to 180 ms while that for arterial blood can range from 150 to 180 ms, depending on $\tau_{180}$. Fully deoxygenated blood can have a T2 as low as 10 ms.

The best way to differentiate muscle and blood is to maximize $T2_b$ through the appropriate selection of $\tau_{180}$ so that $T2_b > T2_m$ (where $T2_m$ is muscle's T2) and then use a spin echo sequence with a long TE. The muscle signal thus decays away while most of the blood signal remains at the data acquisition time. The quantitative figure of merit for muscle suppression is contrast-to-noise ratio, $C_{bm}$, where contrast is the signal difference between blood and muscle. Shown herein below, the blood signal can be manipulated so that its T2 is greater than 100 ms for the full physiological range of oxidation states, substantially greater than $T2_m = 35$ ms. With the T1 of blood and muscle similar, the relationship between $C_{bm}$ and TE in a spin echo projection image is:

$$C_{bm} \alpha L_b e^{-TE/T2_m} - L_m e^{-TE/T2_m}. \quad (2)$$

$L_b$ and $L_m$ are the thicknesses of blood and muscle respectively in the projection direction of the volume being imaged. Maximizing $C_{bm}$ with respect to TE, the optimal value of TE is $$TE_{opt} = \frac{T2_m T2_b}{T2_b - T2_m} \ln\left(\frac{L_m T2_b}{L_b T2_m}\right). \quad (3)$$

For $100 \leq T2_b \leq 180$ ms and for reasonable relative tissue thicknesses $$\left(20 \leq \frac{L_m}{L_b} \leq 100\right),$$

$TE_{opt}$ lies within the range from 200 to 300 ms.

To suppress fat, one can take advantage of its short T1 relative to that of blood and its chemical shift. A short TI inversion recovery sequence (STIR) is used where TI is chosen so that the 90° excitation pulse occurs roughly as the longitudinal magnetization of fat passes through zero. Since blood has a longer T1, its longitudinal magnetization is still strong and inverted just before the 90° pulse. To meet the above requirements exactly, one would have TI≈170 ms assuming TR > 1 s. In practice, a slightly shorter TI (ranging from 120 to 150 ms) is used. The reason for this is that the T1 of subcutaneous fat and bone marrow varies somewhat. For fat with a shorter T1, its longitudinal magnetization would be greater than zero at TI=170 ms. In this situation, the signal from fat and blood will have opposite signs. Hence, if a vessel overlaps fat in the projection image, the fat will reduce the recorded magnitude of the blood since the signal is integrated over the volume, leading to a potential misinterpretation of vessel structure. Using a shorter TI will also yield stronger blood signal in any circumstance. Generally, one cannot expect the STIR sequence to completely eliminate fat.

Fat is also suppressed by making the 90° pulse in the sequence frequency-selective, tipping the magnetization of water (blood and muscle) but not fat into the transverse plane. For this purpose, the 1-$\tau$-3-$\tau$-3-$\tau$-1 binomial pulse is employed. Each element of the binomial pulse is separated by $\tau = 2$ ms so that the excitation spectrum has a null at 250 Hz; thus, the total pulse duration is 6 ms. This pulse is relatively insensitive to machine imperfections. Furthermore, the pulse passes at least 95% of the signal for frequencies within 50 Hz of the selected water frequency and at most 5% of the signal within 50 Hz of the null. This relatively flat response around the water peak and the fat null is particularly useful since $B_o$ field variation over the large field of view is a principal concern when using a frequency-selective pulse for imaging vasculature. The effectiveness of the short TI and the binomial pulse have been experimentally evaluated independently and together for eliminating fat signals.

To ensure the highest possible SNR, the sequence is designed to maximize the blood signal at acquisition time, to minimize flow effects, and to optimize TR for maximum SNR per unit imaging time.

For peak signal at late echo times, $T2_b$ must be maximized. Particularly when % $HbO_2$ is low (i.e., venous blood), $T2_b$ increases significantly as $\tau_{180}$ decreases (see FIG. 1). The minimum $\tau_{180}$ achievable within the constraints of the pulse sequence timing is 12 ms. At this refocussing rate, blood with % $HbO_2 \geq 60\%$ has a $T2 > 100$ ms.

Limits on further reducing $\tau_{180}$ stem from the decision to uniformly space the 180° refocussing pulses between the center of the excitation and the center of the readout. This uniform spacing minimizes spurious echo effects and reduces flow effects. Under this constraint, both the time from the center of the excitation pulse to the center of the first 180° pulse and the time from the center of the last 180° pulse to the center of the readout must be $\tau_{180}/2$. In the current realization, the limiting factor is the duration of the readout (for SNR reasons). The durations of the frequency-selective excitation pulse and of the refocussing pulses are also concerns. To minimize the latter, rectangular pulses are used rather than, for instance, composite pulses. Relaxing the above constraints by using, for instance, off-center readouts, one could refocus more frequently yielding greater signal for deoxygenated blood at the expense of greater flow dephasing. However, $\tau_{180} = 12$ ms has proved adequate in the current work.

For TE≃200 ms as required for good muscle suppression and for $\tau_{180} = 12$ ms, there are 16 refocussing pulses. Using a standard CPMG sequence to realize this pulse train results in substantial signal loss due to $B_0$ inhomogeneities. However, if one always uses $2^n$ pulses where n is an integer, one can virtually eliminate this signal loss by instead using the MLEV sequence (Levitt et al *Advances in Magnetic Resonance*, 11, 47, 1983). CPMG alternates the sign of successive 180° pulses in the refocussing pulse train. This pattern compensates for erroneous flip angle due to $B_1$ inhomogeneities. However, it exacerbates $B_0$ inhomogeneity effects which shift the axis about which the magnetization is flipped. The MLEV sequence compensates for both the $B_0$ and $B_1$ inhomogeneity effects described above by introducing a particular pattern of sign reversals of the individual 180° pulses. For a 16 pulse train the signs of the individual 180° pulses in the train are + + − − − + − − − + + + − − + respectively. To limit spurious echoes, each 180° pulse can be surrounded by spoiling gradient pulses.

One wants to minimize three principal flow effects: ghosting caused by major variations in flow across different phase encoding steps (due to pulsatility); signal loss due to the dephasing of spins as they move through a gradient; and, the wash-in of spins that do not 'see' the full pulse sequence. To avoid ghosting, the sequence is gated to a quiescent period of the heart cycle. This yields the further benefit of minimizing flow velocities during the sequence, reducing the demands for flow compensation and limiting the wash-in of spins even for arterial blood.

One can combat flow dephasing caused by applied gradients using compact gradient waveforms or waveforms with a first moment of zero (constant velocity rephasing) where appropriate. A compact gradient waveform ensures that all flow-related moments remain small. Following this strategy, both the phase encode lobe and the dephasing lobe of the readout gradient are placed as close to the data acquisition period as possible and their durations are minimized. This strategy could be extended by acquiring only about half of k-space, but all of k-space is currently covered for ease of image reconstruction. Projection images are produced; therefore, there are no slice select gradients to dephase flowing spins. The spoiling gradients around the refocussing pulses are the most significant potential source of flow dephasing. By placing these gradients in the projection direction, the expected flow in the gradient direction is minimized (since one generally projects across vessels of interest). The first moment of these waveforms is also nulled using even echo rephasing. When all the spoiling gradients have equal amplitude, spins moving at a constant velocity are completely rephased after every two refocussing pulses. The requirement of constant speed and direction of flow for complete rephasing after every pair of 180° pulses is better satisfied when these pulses occur over a short period, as is the case when $\tau_{180} = 12$ ms. However, one can change the amplitude of the last pair of spoiling gradients, trading off flow compensation for rejection of spurious echoes. While this change does not yield even echo rephasing with this last gradient pair, its duration is short and it occurs close to the acquisition time; thus, the resulting flow-related moments are small, following the compact gradient argument given above.

With the long echo times used, spins moving through an inhomogeneous $B_0$ field become a concern. If one can model the inhomogeneity as a linear gradient over the distance blood flows between even echoes and if one assumes the flow has constant velocity in this period, spins flowing through this inhomogeneity are rephased after every two 180° pulses (if they are evenly spaced). This situation is analogous to spins flowing in the presence of equal amplitude spoiling gradients. Again, the model's validity improves as the frequency of the refocussing pulses increases. Thus, using $\tau_{180} = 12$ ms helps to minimize signal loss as spins flow through $B_0$ inhomogeneities.

Finally, one can choose TR to maximize SNR per unit imaging time. In the current sequence, the relationship between SNR and TR for a fixed total imaging time is:

$$SNR\alpha(1 - 2e^{-TI/T1b} + e^{-TR/T1b})/\sqrt{TR}. \quad (4)$$

Using TI = 140 ms and $T1_b = 900$ ms, the optimal TR is about 1.8 s. This value of TR has the added advantage that one can easily cardiac gate a sequence to it. Furthermore, small fluctuations of TR about 1.8 s due to an irregular heart rate will not affect signal strength much, thus limiting ghosting effects. Specifically, the blood signal varies less than ±10% for 1.5 < TR < 2.1 s.

Figure 2:
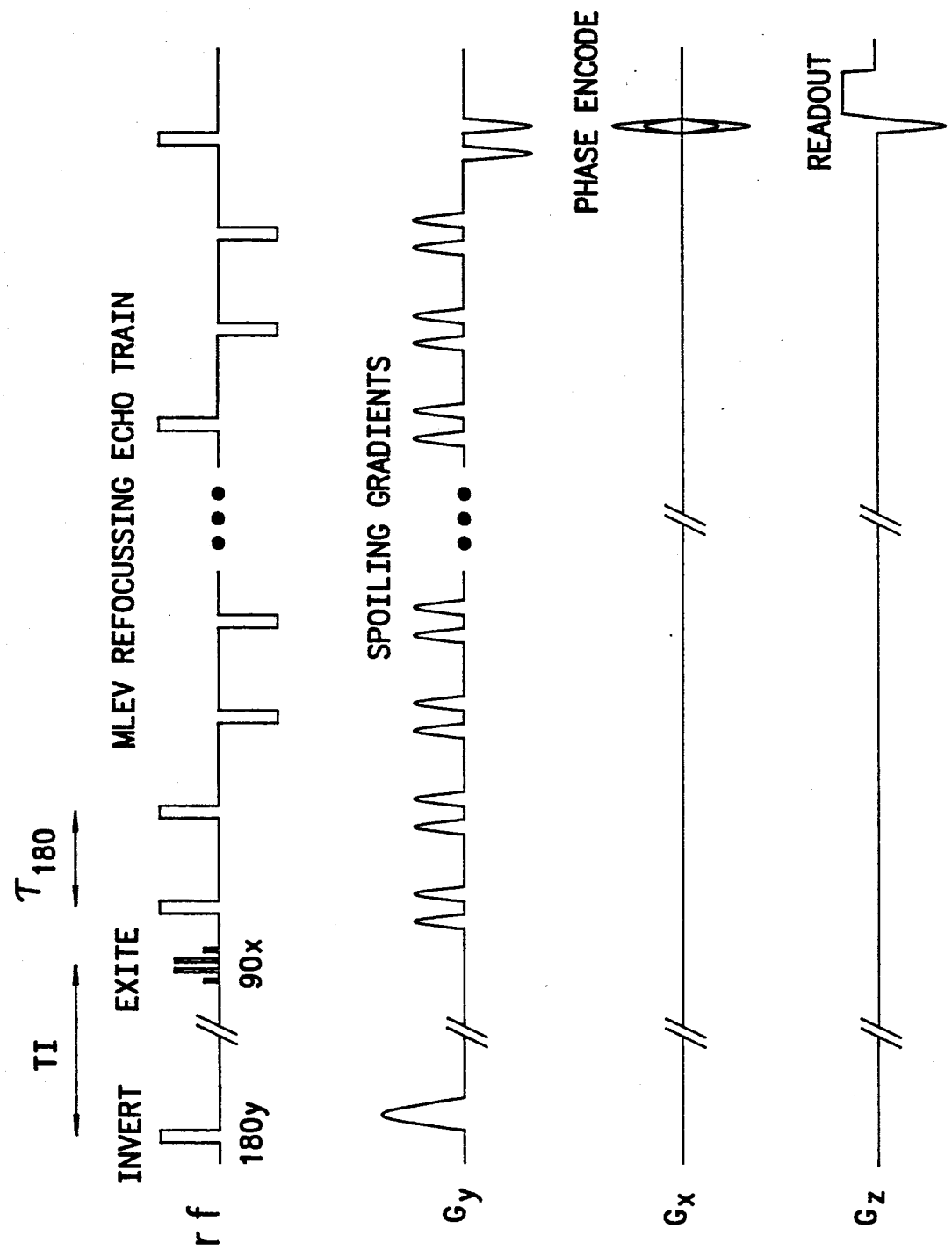
FIG. 2 is a complete pulse sequence for flow independent magnetic resonance projection imaging in accordance with the invention.

The complete pulse sequence is given in FIG. 2. It includes a STIR sequence (TI≃140 ms) with a water-selective 90° pulse for fat suppression, a train of 180° pulses to regularly rephase spins and to increase blood's T2, and data acquisition at a late echo time (TE = 192 ms) for muscle suppression. The sequence was designed by optimizing individual components for specific purposes. Starting with the current parametric values and running a multi-dimensional non-linear optimization, one may reach a slightly better overall solution. However, as the optimization is along relatively independent dimensions, the current solution is likely close to that of an overall optimization. In any case, the variability of the tissue relaxation times make a very precise optimization irrelevant. The given sequence achieves blood isolation in a robust manner.

Figure 3A:
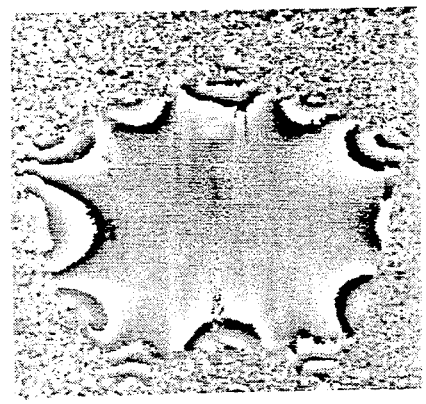
FIG. 3a and FIG. 3b are images showing Bo homogeneity in the coronal plane and an axial scout scan, respectively.

This technique has been implemented on a General Electric 1.5T Signa system with an Oxford P10 (4-coil) magnet and actively shielded gradients. A representative map of the $B_0$ homogeneity in the coronal plane of this magnet is given in FIG. 3(a). The image covers a 40 cm field of view with intensity being proportional to frequency modulo 215 Hz. Pulse durations are kept as short as possible within specific absorption rate (SAR) and machine limitations. Using a quadrature body coil, the average SAR for a 70 kg subject would be about 0.22 W/kg. Where necessary, the sequence is cardiac gated using a plethysmograph.

Several experiments have been performed to demonstrate the effectiveness of sequence components, specifically examining muscle and fat suppression, the T2 increase of deoxygenated blood, and composition of flow effects. Representative is vivo images have been produced to illustrate the technique's overall performance and its potential. In all experiments, images acquired are 256×128 pixels. Unless otherwise specified, no averaging is performed, resulting in acquisition times of about 4 minutes per image.

Figure 3B:
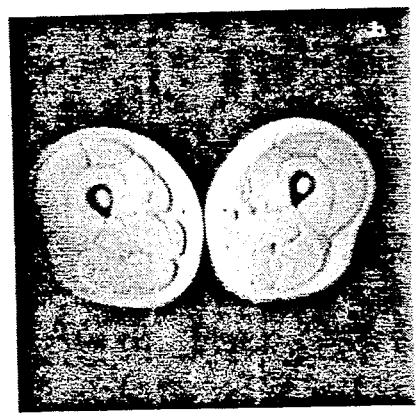
Figure 4A:
FIG. 4a through FIG. 4d are projection images obtained from using the pulse sequence of FIG. 2 in a first experiment.
Figure 4B:
Figure 4C:
Figure 4D:

Experiment 1 examines fat and water suppression. For this purpose, coronal projection images of the thighs of a healthy subject are produced using a 40 cm field of view. FIG. 3(b) shows an axial scout scan of a 10 mm slice through the center of the field of view. This image presents the various tissues to be suppressed —subcutaneous fat, bone marrow, and skeletal muscle. One can also distinguish arteries from veins in this image; arteries have a pulsatile streak artifact while veins do not. Trial A (FIG. 4(a)) uses a standard pulse sequence shown in FIG. 2 with TR/TE/TI/$\tau_{180}$=1800/192/14C/12 ms and no cardiac gating. For Trial B (FIG. 4(b)), the water-selective 90° pulse is replaced by a non-selective pulse (i.e., only STIR for fat suppression). In Trial C (FIG. 4(c)), the water-selective 90° pulse is used but the 180° inversion pulse is turned off (fat suppression only via the 90° pulse). Trial D (FIG. 4(d)) is the same as A except TE =96 ms. Comparing the results of Trials A, B, and C, it is clear that both the STIR sequence and the water-selective 90° pulse are needed for adequate fat suppression. By itself, the STIR sequence leaves a significant residual signal from subcutaneous fat. The water-selective pulse alone yields strong fat signal in regions where $B_0$ inhomogeneity is poor since fat shifts to the water frequency (compare FIGS. 4(c) and 3(a)). Comparing the results of Trials A and D, one sees that the muscle signal may interfere with image interpretation when TE =96 ms while it is virtually nonexistent at TE =192 ms. In all images, ghosting from the femoral artery is evident because the sequence is not cardiac gated.

Figure 5A:
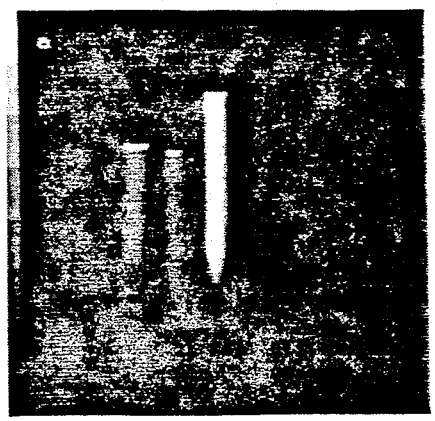
FIG. 5a and FIG. 5b are projection images obtained from using the pulse sequence of FIG. 2 in another experiment.
Figure 5B:
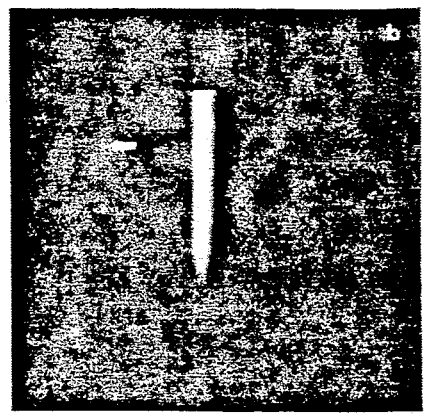

Experiment 2 demonstrates the effect of decreasing $\tau_{180}$ on the T2 of venous blood with poor oxygenation. The phantom to be imaged includes 3 test tubes sitting in a bath of MnCl$_2$ solution with a very short T2. The bath minimizes susceptibility effects in the images at the test tube walls. From left to right, the test tubes contain heparinated blood, blood with no anti-coagulant (over the duration of the study, this blood was in the process of forming a clot), and an MnCl$_2$ solution with T1$\simeq$1000 ms and T2$\simeq$100 ms. The blood was drawn from a healthy volunteer and imaged within 30 minutes of acquisition. Its oxygenation level is estimated to be rather low at about 40%. Trial A (FIG. 5(a)) uses the standard pulse sequence without the inversion 180° pulse (TR/TE/$\tau_{180}$ =2000/192/12 ms). For improved SNR, the images are formed as the average of 2 acquisitions. Trial B (FIG. 5(b)) is the same except $\tau_{180}$=96 ms. Signal strengths for the various test tubes in the two situations are listed in Table 2. Increasing $\tau_{180}$ dramatically decreases the effective T2 of the blood while leaving the T2 of the MnCl$_2$ solution unaffected. In more extensive experimental studies varying % HbO$_2$, TE, and $\tau_{180}$, Eq. [9] quantitatively describes the effects of these parameters on $T2_b$ reasonably well.

TABLE 2

Signal Intensities of Materials in Magnitude Images for Experiment 2

| Material | Trial A | Trial B |
|---|---|---|
| Heparinated Blood | 209 | 16 |
| Whole Blood | 136 | 27 |
| MnCl$_2$ Solution | 647 | 622 |
| Image Background | 16 | 16 |

Figure 6A:
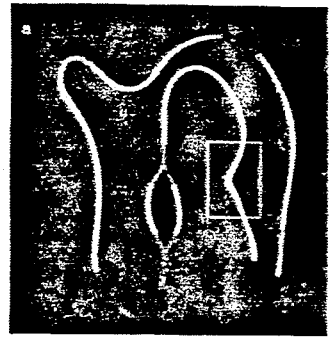
FIG. 6a through FIG. 6d are projection images obtained in using the pulse sequence of FIG. 2 in another experiment.
Figure 6B:
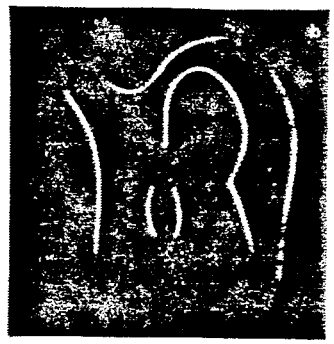
Figure 6C:
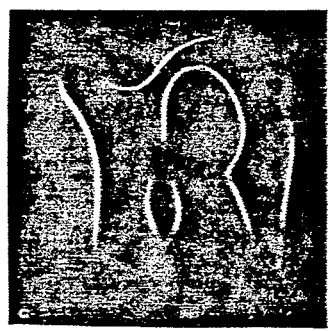
Figure 6D:

Experiment 3 examines flow compensation in the sequence. The phantom is made of flexible plastic tubing with an inner diameter of about 0.6 cm filled with an MnCl$_2$ solution having T1 = 850 ms and T2 = 85 ms. The tubing is laid out to have a full range of orientations. Included is a bifurcation at which point the diameter of the tubing narrows. All images cover a 40 cm field of view. Trials A, B, and C (FIGS. 6(a)-(c)) all use the standard sequence without the inversion 180° pulse (TR/TE/$\tau_{180}$=2000/192/12 ms). The average flow rates through the tubing in A through C are 0, 10, and 20 cm/s respectively. In Trial D, the flow rate is 10 cm/s and $\tau_{180}$=96 ms. In D, the image is acquired in two different ways —with all spoiling gradients the same amplitude and with the last set at a different amplitude (as in the standard sequence). The results were very similar so only the image corresponding to the case of theoretically greater compensation, where all amplitudes are the same, is presented (FIG. 6(d)). Regions of signal loss in the no-flow case (A) indicate regions of very poor. $B_0$ homogeneity (see the $B_0$ inhomogeneity map in FIG. 3(a)). Comparing the results of Trials B and A, virtually no signal loss due to flow effects is seen for flows of 10 cm/s in the central, relatively homogeneous region, even through the tube narrowing and bifurcation. The signal's coherence is still reasonable in the outer region where $B_0$ homogeneity is poor. With flows of 20 cm/s in Trial C, dephasing is clearly more pronounced, particularly in regions of high curvature, at the bifurcation, and in the outer regions; however, substantial signal remains. When the signal is rephased lens frequently in Trial D ($\tau_{180}$=96 ms), flow effects are much worse in all regions for flows of 10 cm/s.

Figure 7A:
FIG. 7a and FIG. 7b are projection images illustrating the effects of the pulse sequence on flow compensation and blood T2.
Figure 7B:
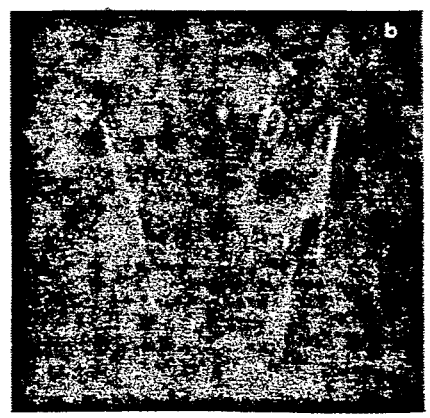

Also examined in the value of using a short $\tau_{180}$ for increasing venous signal and compensating for flow effects in vivo. For this purpose, the standard sequence (cardiac gated, TR/TE/TI=2000/192/140 ms) is applied to the lower legs of a healthy volunteer using a $\tau_{180}$ of 12 ms and 96 ms in Trials A and B respectively (FIG. 7). The disturbance of the signal in the left tibial artery for $\tau_{180}=96$ ms is likely due to the relatively fast flow in this vessel through a region of poor homogeneity (see homogeneity map in FIG. 3(a) noting the different fields of view of the two images —40 cm in FIG. 3(a) vs 32 cm in FIG. 7). The venous signal for $\tau_{180}=96$ ms is slightly lower than for $\tau_{180}=12$ ms (by about a factor of 1.4); however, one would expect a decrease by at least a factor of 2 if the oxygenation level is $\leq 80\%$ (as measured from a sample of the subject's blood drawn from the forearm).

Figure 8:
FIG. 8 is a sagittal projection of the right forearm of subject using the pulse sequence of FIG. 2.
Figure 9:
FIG. 9 is a coronal projection of the vessel tree of the legs of a subject using the pulse sequence of FIG. 2.

To illustrate the potential of the complete sequence, it was used to image various regions of the body. In FIGS. 8 and 9, 2 illustrative examples of these studies are presented: a scan of the right forearm of a healthy volunteer and a full leg scan. Both studies uses the standard pulse sequence gated to a quiescent period of the cardiac cycle where TR/TE/TI/$\tau_{180}$=2200/192/140/12 ms. The forearm image is a single sagittal projection scan with a 24 cm field of view. In this case, the subject is lying supine with his arm above his head. In this image, one can see the brachial, radial, and ulnar arteries and the basilic and cephalic veins as well as many of their smaller tributaries. For the leg scan, the imaging system was the same as described earlier except it had an Oxford P20 (6-coil) magnet and hence significantly better homogeneity (less than 1 ppm variation in the $B_0$ field over 32 cm) giving a larger usable field of view. To generate the full leg image, 4 coronal projection scans were acquired each with a 32 cm field of view and pieced together the resulting images. Total acquisition time for the full leg study was about 20 minutes. In the composite image, the iliac, femoral, and tibial arteries and veins, the popliteal artery, the saphenous veins, and many smaller vessels are visible. Ghosting in the phase encode direction due to body motion (primarily respiratory motion) is noticeable in the pelvic region; in this region, one can also see substantial signal from urine in the bladder. Some interfering signal from the synovial fluid in the knee is also present. Signal in the femoral veins appears to be dephased. Flow in these vessels can be around 30 cm/s even in diastole; thus, the dephasing may be explained by inadequate flow compensation. The edges of some vessels also appear dark, perhaps because of flow dephasing in these regions of strong velocity gradients.

The various experiments demonstrate that the components of the pulse sequence adequately perform their functions. The field of view is limited primarily by $B_0$ inhomogeneity considerations. Frequency variations of more than about $\pm 1$ ppm shift the signal out of the water-selective frequency range of the binomial 90° pulse. Within this field of view the sequence successively suppresses muscle, bone marrow, and subcutaneous fat as per design. The only other material in the limbs which shows up in the current images is the synovial fluid. In other regions of the body, materials with long T1 and T2, specifically cerebrospinal fluid and urine, show up very brightly as would be expected for the given sequence. One may avoid interference from these signals by choosing appropriate projection directions or by localizing the region of signal reception using surface coils or spatially selective 90° pulses (e.g., for spatial and spectral selectivity).

Blood signal coherence is effectively maintained by the sequence. If anything, the T2 of venous blood in vivo appears to be longer than that expected based on in vitro experiments (reducing the need of a short $\tau_{180}$ for this purpose). Flow compensation appears adequate in most vessels in the current images. In more demanding situations (e.g., flow through stenoses), one can employ more extensive flow compensation techniques (e.g., higher order gradient moment nulling and/or more compact, gradient waveforms).

The sequence generally acquires signal from all the blood in the volume of interest. For clinical purposes, this may yield too much signal, with many overlapping vessels yielding a confusing image. One can simplify the image by modifying the sequence to exploit flow information. For instance, one could apply flow-dephasing gradients in the 200 ms between the 90° pulse and the acquisition to eliminate signal from almost all flowing blood (except that with no component in the chosen gradient direction) leaving only stationary blood (indicating, for instance, 100% stenosis). One can dephase arterial blood upstream and allow it to wash in to the region leaving signal only from the veins. In regions where flow effects are not substantial, one can manipulate the signal strength of deoxygenated blood in a controlled manner by varying $\tau_{180}$. This may allow oxygenation levels in vivo to be estimated.

In conclusion, the success of the in vivo studies demonstrates the potential for MR angiography using flow-independent parameters. The technique, in accordance with the invention will be a valuable addition to the clinician's array of tools for exploring particular vascular problems. For instance, several of the modifications described above should prove useful in the study of deep venous thrombosis particularly in situations of 100% stenoses where there is virtually no flow.

I claim:

1. A signal acquisition method for use in flow-independent magnetic resonance projection angiography comprising the steps of
   a) positioning a body having muscle, fat, and blood in a static magnetic field,
   b) applying a first RF pulse to flip magnetic spins of atoms in said body by 180°,
   c) applying a second RF pulse after a time period related to T1 of fat to differentiate magnetic spins of fat from magnetic spins of muscle and blood,
   d) applying a sequence of 180° RF pulses to refocus magnetic spins of blood and increase the T2 time for blood and permit acquisition of data at a late echo time and thereby differentiate magnetic spins of muscle from magnetic spins of blood,
   e) applying orthogonal linear gradients to detect a spin echo from blood, and
   f) detecting a spin echo signal.

2. The method as defined by claim 1 wherein said step of applying a second RF pulse includes applying a 90° RF pulse.

3. The method as defined by claim 1 wherein said step of applying a second RF pulse includes applying a frequency selective group of pulses for flipping magnetic spins of water.

4. The method as defined in claim 1 wherein said step of applying a sequence of 180° pulses comprises applying a MLEV refocussing echo train.

5. The method as defined by claim 1 wherein said step of applying orthogonal linear gradients includes applying spoiling gradients along one axis, a phase encode gradient along another axis, and a readout gradient along another axis.

6. A signal acquisition method for use in flow-independent magnetic resonace projection angiography comprising the steps of a) positioning a body having muscle, fat and blood in a static magnetic field, b) applying a frequency selective group of pulses for flipping magnetic spins of water after a time period related to the relaxation time T1 of fat to differentiate magnetic spins of fat from magnetic spins of muscle and blood, c) applying a sequence of 180° RF pulses to refocus magnetic spins of blood and increase the relaxation time T2 for blood and permit acquisition of data at a late echo time and thereby differentiate muscle from blood, d) applying orthogonal linear gradients to detect a spin echo from blood, and e) detecting a spin echo signal.

* * * * *